(12) United States Patent
Sashida et al.

(10) Patent No.: US 11,268,988 B2
(45) Date of Patent: Mar. 8, 2022

(54) DETECTION SUBSTRATE, ASSEMBLY, AND METHOD FOR MANUFACTURING DETECTION SUBSTRATE

(71) Applicant: SHINDENGEN ELECTRIC MANUFACTURING CO., LTD., Tokyo (JP)

(72) Inventors: Kazuyuki Sashida, Saitama (JP); Kenichi Suzuki, Saitama (JP); Mizue Yamaji, Saitama (JP); Kenichi Yoshida, Saitama (JP); Shinji Kunori, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/766,277

(22) PCT Filed: Nov. 24, 2017

(86) PCT No.: PCT/JP2017/042132
§ 371 (c)(1),
(2) Date: May 21, 2020

(87) PCT Pub. No.: WO2019/102571
PCT Pub. Date: May 31, 2019

(65) Prior Publication Data
US 2020/0371137 A1    Nov. 26, 2020

(51) Int. Cl.
*G01R 15/18* (2006.01)
*G01R 19/00* (2006.01)

(52) U.S. Cl.
CPC ....... *G01R 15/181* (2013.01); *G01R 19/0092* (2013.01)

(58) Field of Classification Search
CPC .... G01R 15/181; G01R 19/0092; G01R 3/00; H01F 5/003
(Continued)

(56) References Cited

U.S. PATENT DOCUMENTS 6,624,624 B1 * 9/2003 Karrer ................. G01R 15/181
                                                    324/117 R
2003/0137388 A1    7/2003 Meier
(Continued)

FOREIGN PATENT DOCUMENTS

CN    102087903 A    6/2011
JP    H10247718 A    9/1996
(Continued)

OTHER PUBLICATIONS

International Preliminary Repor on Patentability of the International Searching Authority in the international applicaton No. PCT/JP2017/042132, dated Dec. 28, 2018 and English translation provided by Google Translate.
(Continued)

*Primary Examiner* — Tung X Nguyen
*Assistant Examiner* — Robert P Alejnikov, Jr.
(74) *Attorney, Agent, or Firm* — Ladas & Parry, LLP

(57) ABSTRACT

A detection substrate 150 has a body film 1a having a through hole 91; a winding wire part 10 provided on a surface of one side of the body film 1a, on a surface of another side of the body film 1a and in the through hole 91, and disposed so as to surround a current to be detected; and a winding return wire part 50, provided on the body film 1a, connected at a terminal end part of the winding wire part 10 and returning from the terminal end part toward a starting end part side.

8 Claims, 16 Drawing Sheets

(58) Field of Classification Search
USPC .......................................................... 324/126
See application file for complete search history.

(56) References Cited

U.S. PATENT DOCUMENTS

| | | | |
|---|---|---|---|
| 2004/0257061 | A1 | 12/2004 | De Buda |
| 2006/0220774 | A1* | 10/2006 | Skendzic ............. G01R 15/181 336/200 |
| 2014/0167710 | A1 | 6/2014 | Ingino, Jr. et al. |
| 2014/0167740 | A1* | 6/2014 | Gilbert .................... G01R 1/20 324/127 |
| 2016/0242278 | A1 | 8/2016 | Yoshida |
| 2018/0172738 | A1* | 6/2018 | Kashiwaya ........... G01R 15/181 |
| 2020/0373379 | A1* | 11/2020 | Sashida ................... H01L 28/10 |
| 2020/0386795 | A1* | 12/2020 | Suzuki .................... G01R 3/00 |
| 2021/0123953 | A1* | 4/2021 | Sashida ................ G01R 15/181 |

FOREIGN PATENT DOCUMENTS

| | | | |
|---|---|---|---|
| JP | 2001102230 A | | 4/2001 |
| JP | 2002221538 A | * | 8/2002 |
| JP | 2002221538 A | | 8/2002 |
| JP | 2006120858 A | | 5/2006 |
| JP | 2007085951 A | | 4/2007 |
| JP | 2009135523 A | | 6/2009 |
| JP | 2013004619 A | | 1/2013 |
| JP | 2013130571 A | | 7/2013 |
| JP | 2012088224 A | | 5/2015 |
| JP | 2015097252 A | | 5/2015 |
| JP | 2017111052 A | | 6/2017 |

OTHER PUBLICATIONS

Written Opinion of the International Searching Authority from PCT/JP2017/042132, dated Feb. 13, 2018, pp. 3-5 with English translation provided by applicant.
International Preliminary Report on Patentability, chapter II, from PCT/JP2017/042132, dated May 31, 2019, pp. 1-5 with English translation from WIPO.
Extended European Search Report from EP app. No. 17933074.1, dated May 11, 2021.
Notice of Reasons for Refusal from JP app. no. 2019-556038, dated Jun. 1, 2021, with English translation from Global Dossier.
First Office Action from CN app. No. 201780097076.2, dated Nov. 2, 2021, with machine English translation from Google Translate, all pages.

* cited by examiner

DETECTION SUBSTRATE, ASSEMBLY, AND METHOD FOR MANUFACTURING DETECTION SUBSTRATE

CROSS-REFERENCE TO RELATED APPLICATION

The present application is the U.S. national phase of PCT Application PCT/JP2017/042132 filed on Nov. 24, 2017, the disclosure of which is incorporated herein by reference in its entirety.

TECHNICAL FIELD

The present invention relates to a detection substrate and an assembly having a winding wire part, and method for manufacturing the detection substrate.

BACKGROUND ART

Conventionally, a current detection sensor using a Rogowski coil has been known. The Rogowski coil is a coreless coil, and has a winding core, a winding wire wound around the winding core, and a return wire connected to the terminal end part of the winding wire and returning to a starting end part side (for example, see JP 2012-88224 A). In addition, the Rogowski coil is connected to an integrator, and a change in current in an object to be measured can be measured by integrating the output voltage with the integrator. In such a Rogowski coil, the sensitivity is increased with an increase in the number of turns per unit distance.

Meanwhile, a sensor has been proposed which detects a change in current flowing through a semiconductor device (for example, a switching element). However, conventional sensors cannot detect a change in current flowing through the semiconductor device with sufficient accuracy, and there is a problem that the size of the entire device including the sensor may be increased.

SUMMARY OF INVENTION

Problem to be Solved by Invention

The present invention provides a detection substrate and an assembly that are not too large in size and are capable of accurately detecting an operation, and a method for manufacturing the detection substrate.

Means to Solve the Problem

A detection substrate according to the present invention may comprise:
a body film having a through hole;
a winding wire part provided on a surface of one side of the body film, on a surface of another side of the body film and in the through hole, and disposed so as to surround a current to be detected; and
a winding return wire part, provided on the body film, connected at a terminal end part of the winding wire part and returning from the terminal end part toward a starting end part side.

In the detection substrate according to the present invention,
the winding return wire part may be provided on the surface of the one side of the body film or the surface of the other side of the body film.

In the detection substrate according to the present invention,
the winding return wire part may not pass through the winding wire part.

In the detection substrate according to the present invention,
the winding return wire part may be provided inward or outward of a periphery of the winding wire part.

In the detection substrate according to the present invention,
the winding wire part may have a second straight part provided on the surface of the one side of the body film, a third straight part extending from an end part of the second straight part so as to pass through the through hole, a fourth straight part provided on an end part of the third straight part and provided on the surface of the other side of the body film, and a fifth straight part extending from an end part of the fourth straight part so as to pass through the through hole, and
a plurality of the third straight parts or a plurality of the fifth straight parts may be provided for the fourth straight part.

In the detection substrate according to the present invention,
when a plurality of the third straight parts are provided, a transverse sectional area of each of the third straight parts may be smaller than a transverse sectional area of the second straight part and a transverse sectional area of the fourth straight part, and
when a plurality of the fifth straight parts are provided, a transverse sectional area of each of the fifth straight parts may be smaller than a transverse sectional area of the second straight part and a transverse sectional area of the fourth straight part.

The detection substrate according to the present invention may further comprise:
a detection target part, which is provided in the body part and through which at least a part of current flowing in an object to be measured flows, wherein
the winding wire part and the winding return wire part may be disposed so as to surround the detection target part.

An assembly, according to the present invention, may comprise:
the detection substrate according to claim 7; and
an electronic device, which is the object to be measured, disposed on the detection substrate.

A method for manufacturing a detection substrate, according to the present invention, may comprise steps of:
forming a through hole in a body film;
forming a metal film in the body film and the through hole;
forming a metal layer at portions, corresponding to a winding wire part and a winding return wire part, on the metal film; and
removing portions of the metal film other than the portions corresponding to the winding wire part and the winding return wire part, wherein
the winding wire part may be formed by the metal layer and the metal film on a surface of one side of the body film, on a surface of another side of the body film and in the through hole, and
the winding return wire part may be formed by the metal layer and the metal film on the surface of the one side of the body film or the surface of the other side of the body film.

Effects of Invention

The present invention uses a body film in which a winding wire part and a winding return wire part are provided. Use of such body film allows a through hole (via) penetrating the body film to be small. As a result, the number of turns per unit length of the winding wire part can be increased, and changes in current can be accurately detected. Furthermore, by providing a detection substrate as in the present invention, it is possible to detect an operation of an existing semiconductor device or the like, and it is possible to achieve high versatility.

DESCRIPTION OF EMBODIMENTS

First Embodiment

<<Configuration>>

Figure 2:
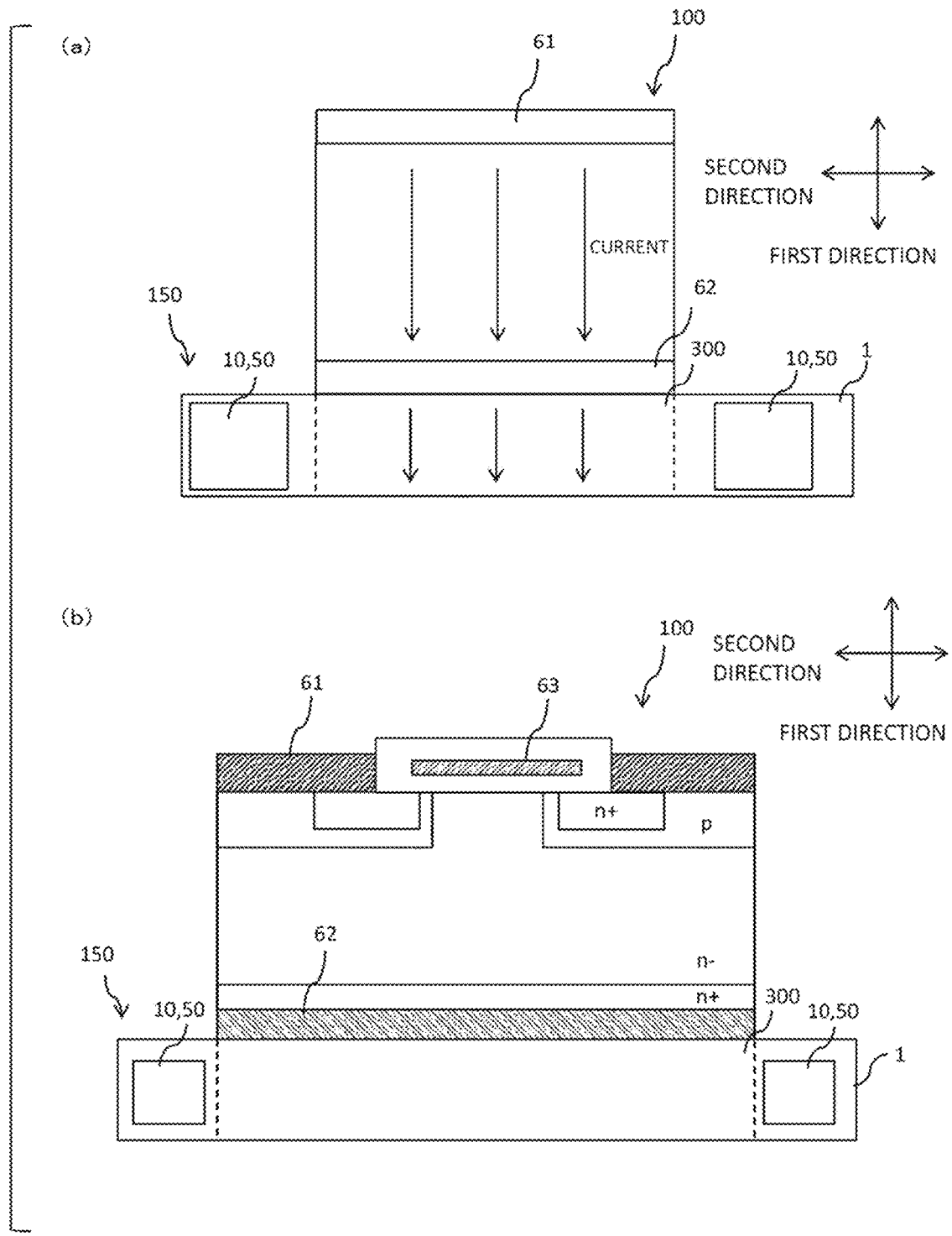
FIG. 2(a) is a longitudinal section of a semiconductor device and a detection substrate that can be used in the first embodiment of the present invention.
FIG. 2(b) is a longitudinal section of another semiconductor device and a detection substrate that can be used in the first embodiment of the present invention.

A detection substrate, an assembly, and a method for manufacturing the detection substrate according to the present embodiment will be described. In the present embodiment, "one side" means the upper side in FIG. 2 and "other side" means the lower side in FIG. 2. Further, the vertical direction in FIG. 2 (the direction from the other side toward one side and the direction from one side toward the other side) is referred to as a "first direction", the horizontal direction in FIG. 2 is referred to as a "second direction", and the front-back direction of the page of FIG. 2 is referred to as a "third direction". An in-plane direction including the second direction and the third direction is referred to as a "plane direction", and a state where the view from the one side is referred to as a "plan view".

Figure 1:
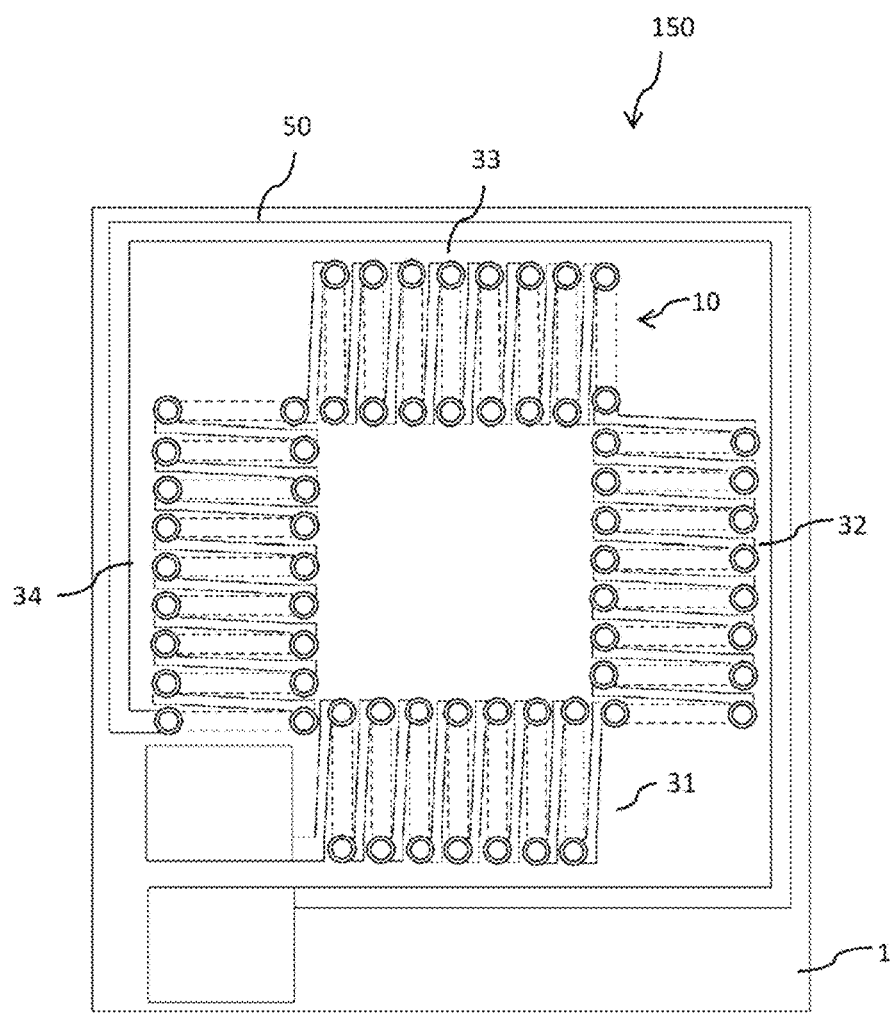
FIG. 1 is a plan view of a detection substrate that can be used in a first embodiment of the present invention.
Figure 1:
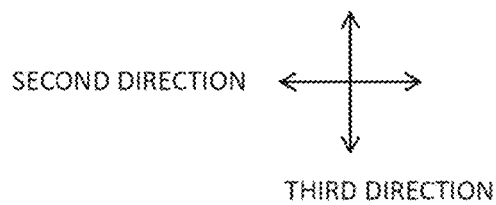

As shown in FIG. 1, a detection substrate 150 of the present embodiment may have a body part 1, a winding wire part 10 provided in the body part 1 and disposed so as to surround a current to be detected, and a winding return wire part 50 connected at a terminal end part of the winding wire part 10 and returning from the terminal end part side toward a starting end part side. The detection substrate 150 is arranged so as to surround the measurement target. For example, as shown in FIG. 2, the measurement target may be a semiconductor device 100 having a first electrode 61 provided on a first main surface and a second electrode 62 provided on a second main surface. It is to be noted that the measurement target does not need to be the semiconductor device 100, and may be an electronic device not using a semiconductor.

The detection substrate 150 of the present embodiment may be configured of a flexible substrate. In this case, the body part has a flexible body film 1a (See FIG. 3). The winding wire part 10 may be provided on a surface of one side of the body film 1a, on the surface of the other side of the body film 1a, and in a through hole 91 such as a via provided in the body film 1a, and the winding return wire part 50 may be provided on the surface of one side of the body film 1a or the surface of the other side of the body film 1a (See FIG. 3). The detection substrate 150 may be placed on a printed substrate such as a glass epoxy substrate, or may be placed on another substrate such as a ceramic substrate, a resin substrate, and a metal substrate.

The winding wire part 10 and the winding return wire part 50 may be formed of a metal material such as copper or aluminum, but the present invention is not limited thereto, and the winding wire part 10 and the winding return wire part 50 may be formed of a semiconductor material such as polysilicon.

The winding return wire part 50 may not pass through the winding wire part 10. In the present embodiment, as shown in FIG. 1, the winding return wire part 50 is disposed so as to surround the outward of the periphery of the winding wire part 10.

Figure 9:
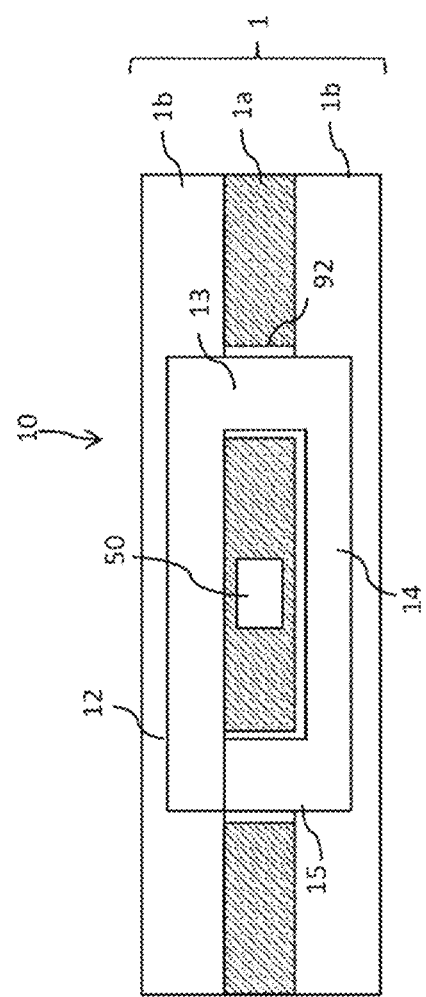
FIG. 9 is a longitudinal sectional view of yet another detection substrate that can be used in the first embodiment of the present invention. In order to show that the winding return wire part passes through the inside of the winding wire part, FIG. 9 also shows a second straight part on the front surface side of the paper surface that is not visible in the longitudinal section.

Although FIG. 1 shows the aspect in which the winding return wire part 50 does not pass through the winding wire part 10, the present invention is not limited thereto, and the winding return wire part 50 may pass through the winding wire part 10 as shown in FIG. 9. In the present embodiment, the aspect shown in FIG. 1 is referred to as a "quasi Rogowski coil", and the aspect shown in FIG. 9 is referred to as a "Rogowski coil". Use of reference numerals "10, 50"

in FIG. 2 indicates that the quasi Rogowski coil may be used or the Rogowski coil may be used.

Figure 3:
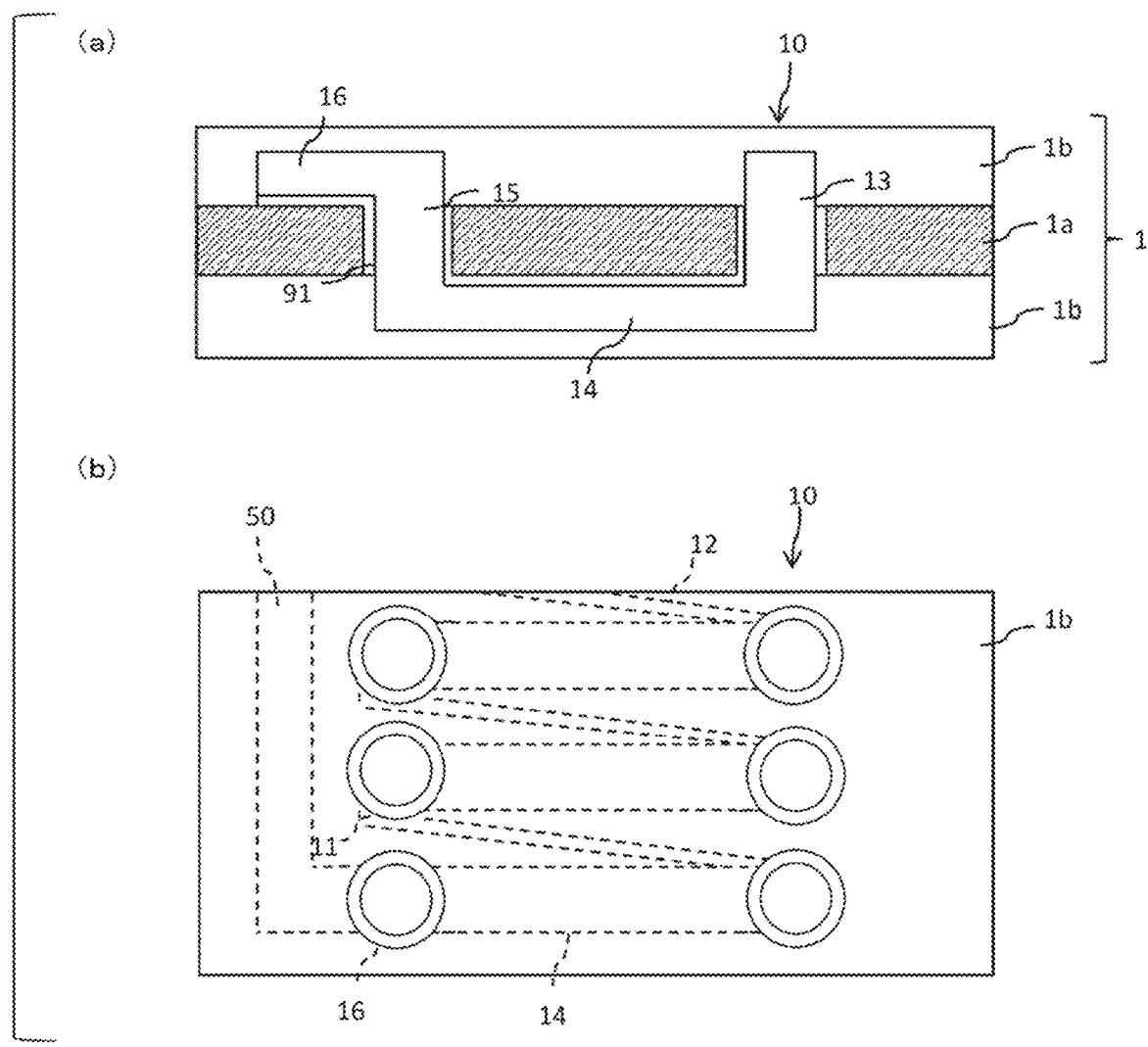
FIG. 3(a) is a longitudinal sectional view of a detection substrate that can be used in the first embodiment of the present invention.
FIG. 3(b) is a plan view of the detection substrate shown in FIG. 3(a).
Figure 8:
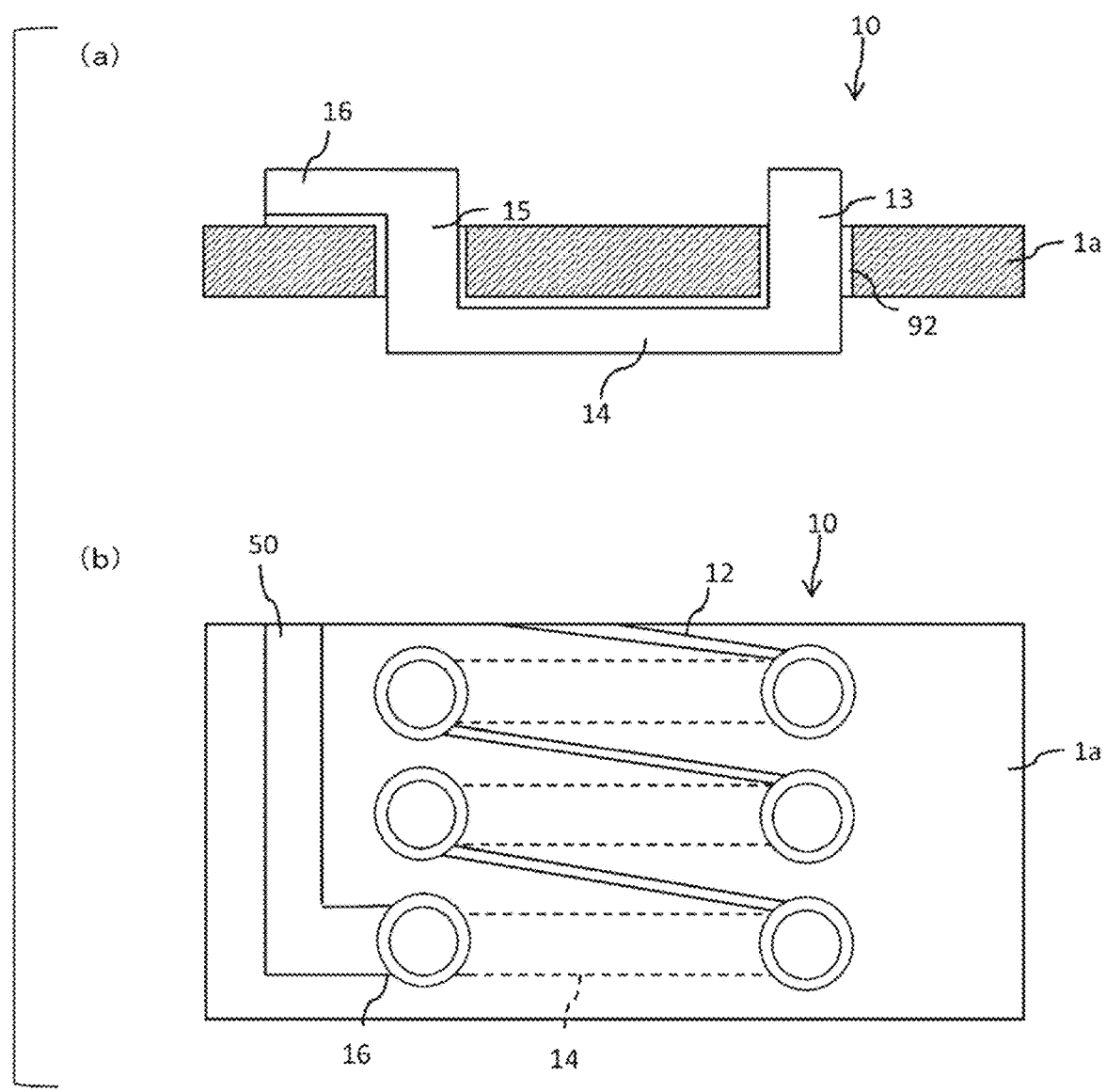
FIG. 8(a) is a longitudinal sectional view for explaining the manufacturing process advanced from FIG. 7(a)
FIG. 8(b) is a plan view of the drawing shown in FIG. 8(a).

As shown in FIG. 3, the winding wire part 10 may have: a first straight part 11 along a winding direction; a second straight part 12 extending toward the peripherally inward (to the right in FIG. 3) from the end of the first straight part 11 and extending in a plane direction (direction including the second direction and the third direction) along the winding direction; a third straight part 13 extending from one side toward the other side from the end of the second straight part 12; a fourth straight part 14 extending toward the peripherally outward (to the left side in FIG. 3) from the end of the third straight part 13 and extending in the plane direction along the direction perpendicular to the winding direction; and a fifth straight part 15 extending from the other side toward one side from the end of the fourth straight part 14 (first aspect). Further, a sixth straight part 16 extending toward the peripherally outward from the end of the fifth straight part 15 in the plane direction may be provided at the terminal end part of the winding wire part 10, and the end of the sixth straight part 16 and the starting end part of the winding return wire part 50 may be connected to each other. The winding return wire part 50 may extend in the surface direction on the surface of one side of the body film 1a. As shown in FIG. 8, an aspect in which the first straight part 11 is not provided can also be adopted.

Unlike the aspect described above, the winding wire part 10 may have: a first straight part 11 along a winding direction; a second straight part 12 extending toward the peripherally inward from the end of the first straight part 11 and extending in a plane direction along the winding direction; a third straight part 13 extending from the other side toward one side from the end of the second straight part 12; a fourth straight part 14 extending toward the peripherally outward from the end of the third straight part 13 and extending in the plane direction along the direction perpendicular to the winding direction; and a fifth straight part 15 extending from one side toward the other side from the end of the fourth straight part 14 (second aspect). Further, a sixth straight part 16 extending toward the peripherally outward from the end of the fifth straight part 15 in the plane direction may be provided at the terminal end part of the winding wire part 10, and the end of the sixth straight part 16 and the starting end part of the winding return wire part 50 may be connected to each other. The winding return wire part 50 may extend in the surface direction on the surface of the other side of the body film 1a.

The first electrode 61 of the semiconductor device 100 may be provided on the first main surface of the semiconductor layer, and the second electrode 62 may be provided on the second main surface of the semiconductor layer. The semiconductor device 100 may be a switching element, for example, a vertical MOSFET. As shown in FIG. 2(b), when the semiconductor device 100 is a vertical. MOSFET, the first electrode 6 may be a source electrode and the second electrode 62 may be a drain electrode. It is to be noted that the reference numeral 63 in FIG. 2(b) denotes a gate electrode.

Figure 10:
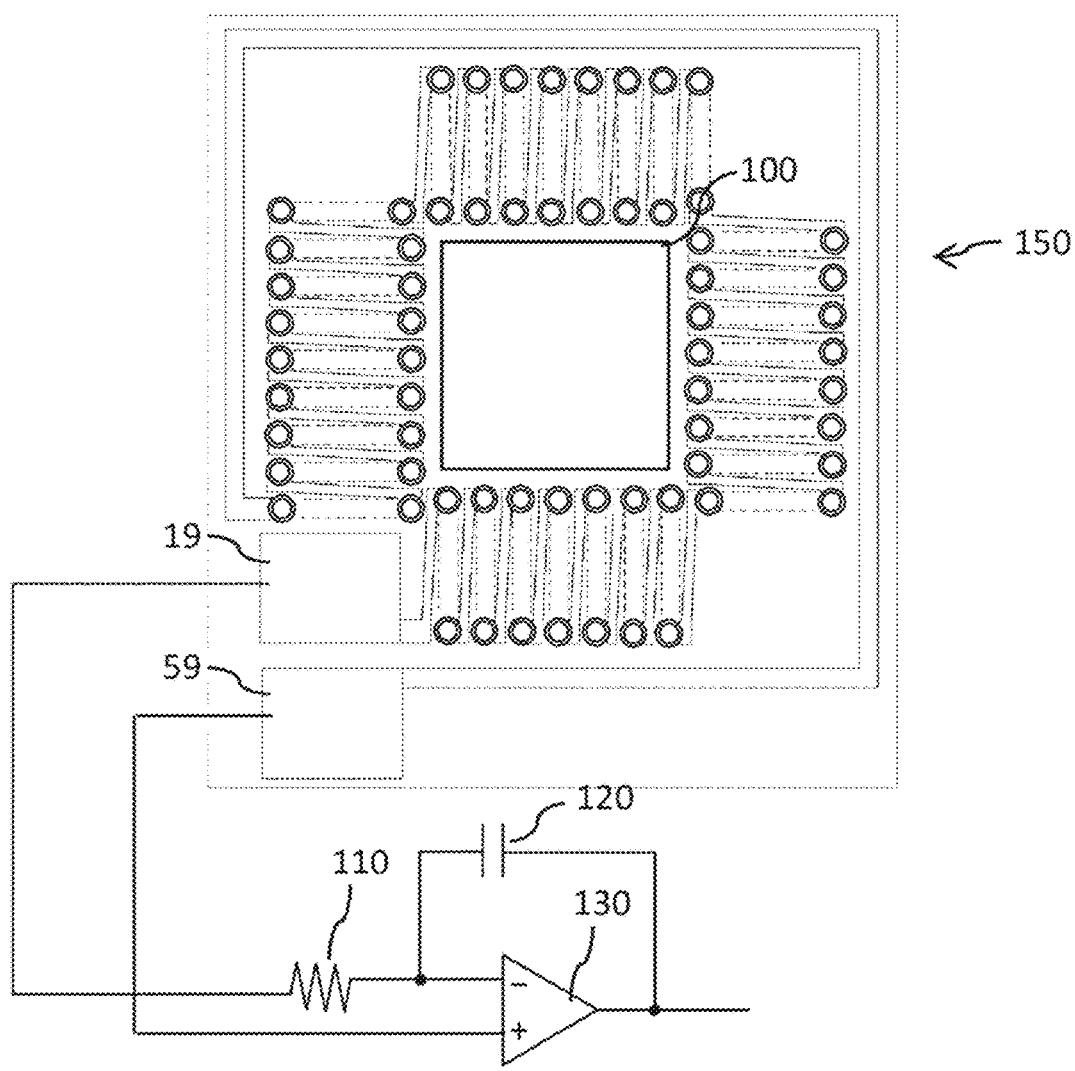
FIG. 10 is a view showing a relationship between a detection substrate and an integration circuit that can be used in the first embodiment of the present invention.

As shown in FIG. 10, an integration circuit may be formed on the winding return wire part 50 and the winding wire part 10 of the present embodiment by being connected to a resistor portion 110, a capacitor 120, and an operational amplifier 130 provided outside the semiconductor device 100. As an example, in FIG. 10, a winding wire electrode pad 19 connected to the starting end part of the winding wire part 10 is connected to the resistor portion 110, the resistor portion 110 is connected to the capacitor 120 and the inverting input terminal of the operational amplifier 130, and a winding return wire electrode pad 59 connected to the terminal end part of the winding return wire part 50 is connected to the non-inverting input terminal of the operational amplifier 130.

As shown in FIG. 1, the winding wire part 10 may have an A-direction winding wire part 31 extending in the second direction, a B-direction winding wire part 32 connected to the end of the A-direction winding wire part 31 and extending in the third direction, a C-direction winding wire part 33 connected to the end of the B-direction winding wire part 32 and extending in the second direction, and a D-direction winding wire part 34 connected to the end of the C-direction winding wire part 33 and extending in the third direction. When the aspect described above is employed, each of the direction winding wire parts 31 to 34 can be linearly formed, which is advantageous in that they can be manufactured relatively easily. The present embodiment describes the aspect using four direction winding wire parts 31 to 34. However, the present invention is not limited thereto, and three direction winding wire parts may be used to form a triangular shape in the plane direction, or five or more direction winding wire parts may be used to form a polygonal shape in the plane direction.

The A-direction winding wire part 31, the B-direction winding wire part 32, the C-direction winding wire part 33, and the D-direction winding wire part 34 may correspond to each other in length. The state where they correspond to each other in length indicates that the length of the A-direction winding wire part 31, the length of the B-direction winding wire part 32, the length of the C-direction winding wire part 33, and the length of the D-direction winding wire part 34 are respectively within the range of ±5% of the average value of the A-direction winding wire part 31, the B-direction winding wire part 32, the C-direction winding wire part 33, and the D-direction winding wire part 34. The numbers of turns included in the A-direction winding wire part 31, the B-direction winding wire part 32, the C-direction winding wire part 33, and the D-direction winding wire part 34 may be the same. Since the A-direction winding wire part 31 is connected to the winding wire electrode pad 19, the number of turns of the A-direction winding wire part 31 may be less than the numbers of turns of the B-direction winding wire part 32, the C-direction winding wire part 33, and the D-direction winding wire part 34 by, for example, one, two, or more.

The detection substrate 150 may have a detection target part 300 in which at least a part of the current flowing in an electronic device such as the semiconductor device 100, which is the measurement target, flows, and the winding wire part 10 and the winding return wire part 50 that are arranged so as to surround the detection target part 300. More specifically, the first electrode 61 or the second electrode 62 may be placed on the detection substrate 150, a current from the electrodes 61 and 62 flows in the detection substrate 150, and the winding wire part 10 and the winding return wire part 50 may be disposed at a position surrounding a path (detection target part 300) through which this current flows. It is to be noted that FIG. 2(b) shows an aspect in which the drain electrode serving as the second electrode 62 is placed on the detection substrate 150.

When the detection is performed using a part of the current flowing in the semiconductor device 100, the relationship between the current actually flowing and the current flowing in the detection target part 300 may be calculated or measured in advance, and using the result, the current actually flowing in the semiconductor device 100 may be measured from the current flowing in the detection target part 300.

In the above aspect, the linear part is described using a "straight part". That is, the aspect is described using the first straight part 11 as an example of the first linear part, the second straight part 12 as an example of the second linear part, the third straight part 13 as an example of the third linear part, the fourth straight part 14 as an example of the fourth linear part, the fifth straight part 15 as an example of the fifth linear part, and the sixth straight part 16 as an example of the sixth linear part. However, the present invention is not limited thereto. The respective linear parts may be curved, or only some of the plurality of linear parts may be straight parts.

<<Manufacturing Method>>

Next, an example of a method for manufacturing the detection substrate 150 according to the present embodiment will be described. This is merely an example, and the present invention is not limited to this aspect.

Figure 4:
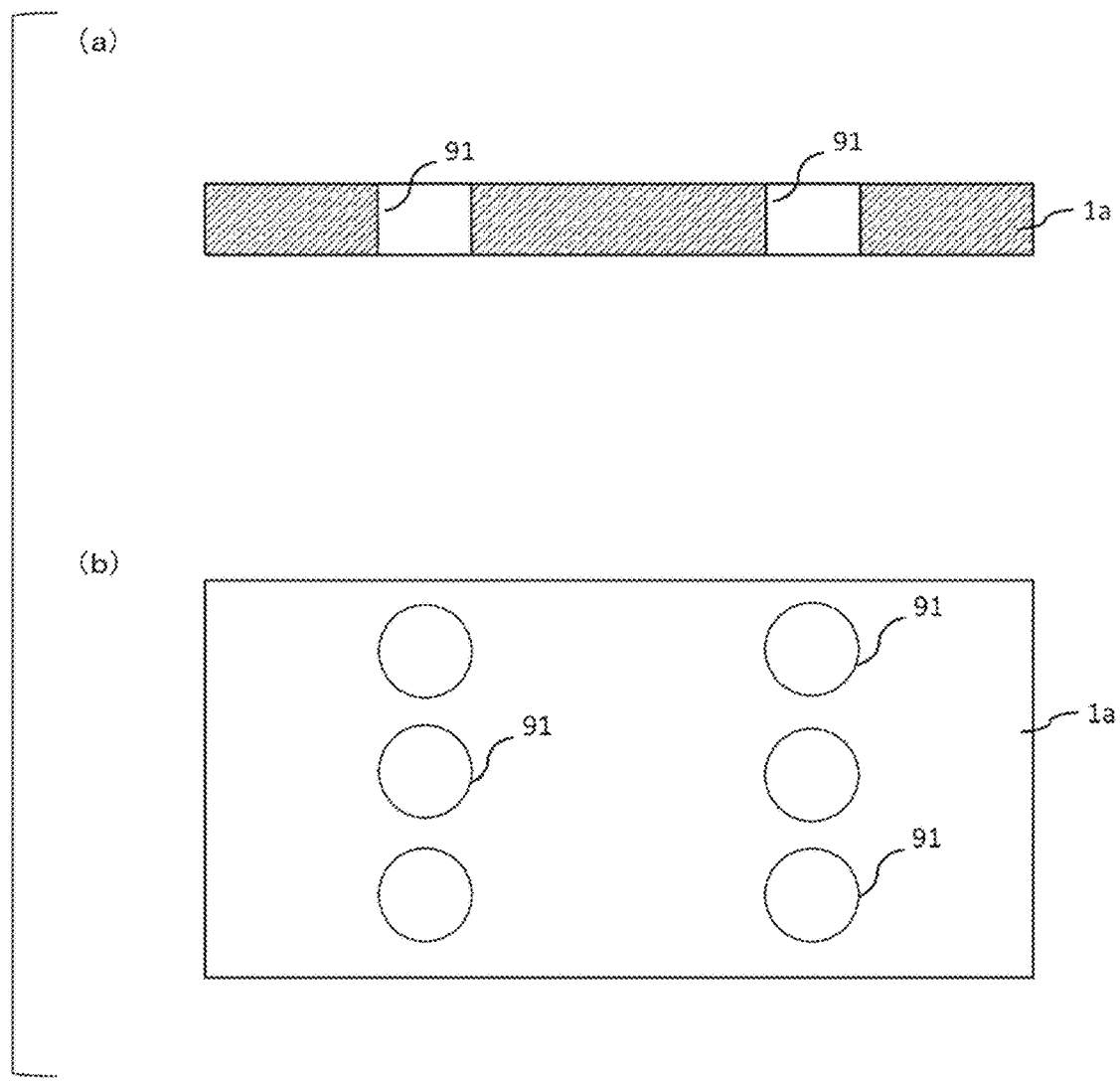
FIG. 4(a) is a longitudinal sectional view for explaining a manufacturing process of a detection substrate that can be used in the first embodiment of the present invention.
FIG. 4(b) is a plan view of the drawing shown in FIG. 4(a).

The through hole 91 is formed in the body film 1 made of a polyimide film or the like (See FIG. 4).

Figure 5:
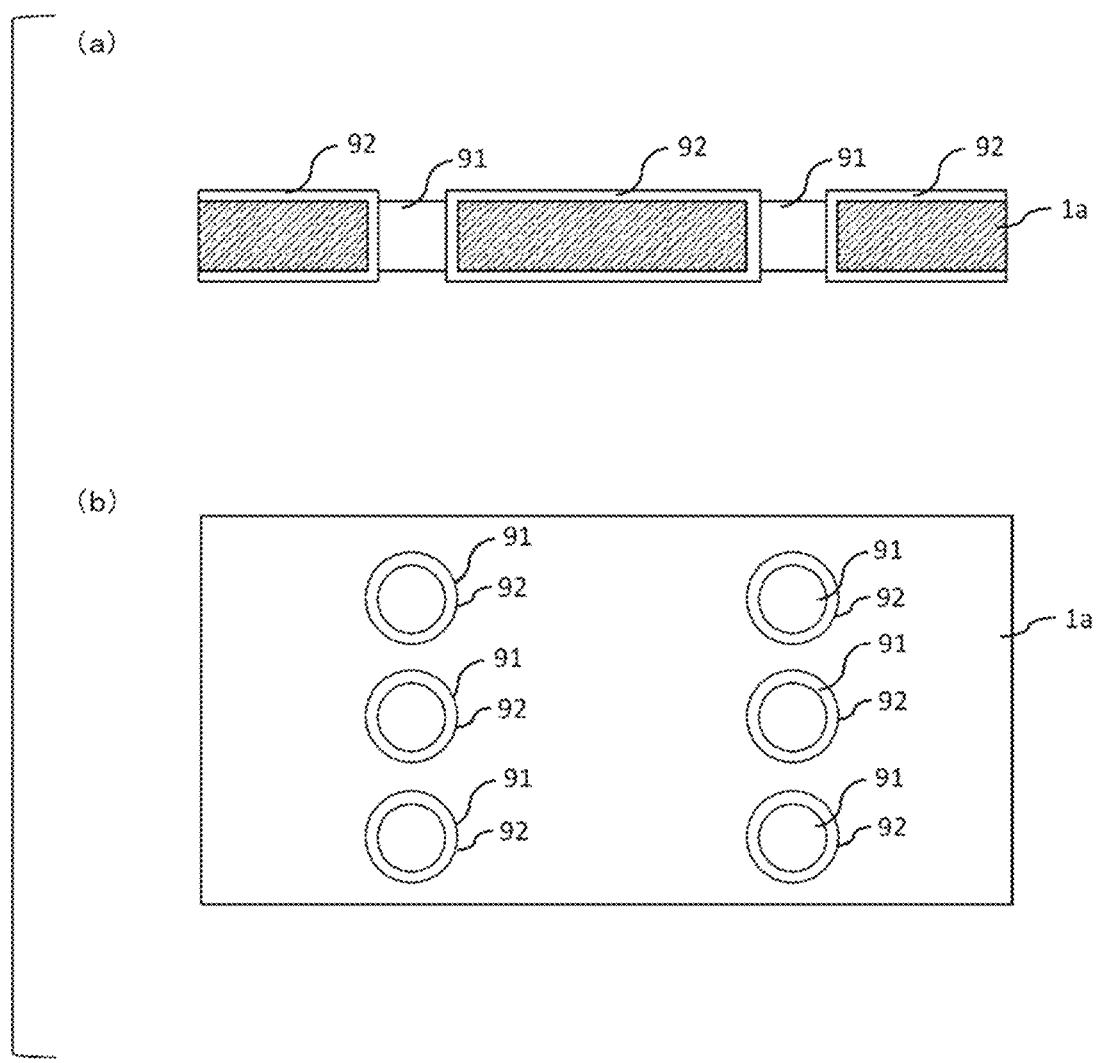
FIG. 5(a) is a longitudinal sectional view for explaining the manufacturing process advanced from FIG. 4(a)
FIG. 5(b) is a plan view of the drawing shown in FIG. 5(a).

Sputtering is applied to the surface including the front surface and the rear surface of the body film 1 (See FIG. 5). At this time, a metal film 92 is formed also on the inner peripheral surface of the through hole 91. It is to be noted that the "surface" of the present embodiment includes both the front surface and the rear surface.

Figure 6:
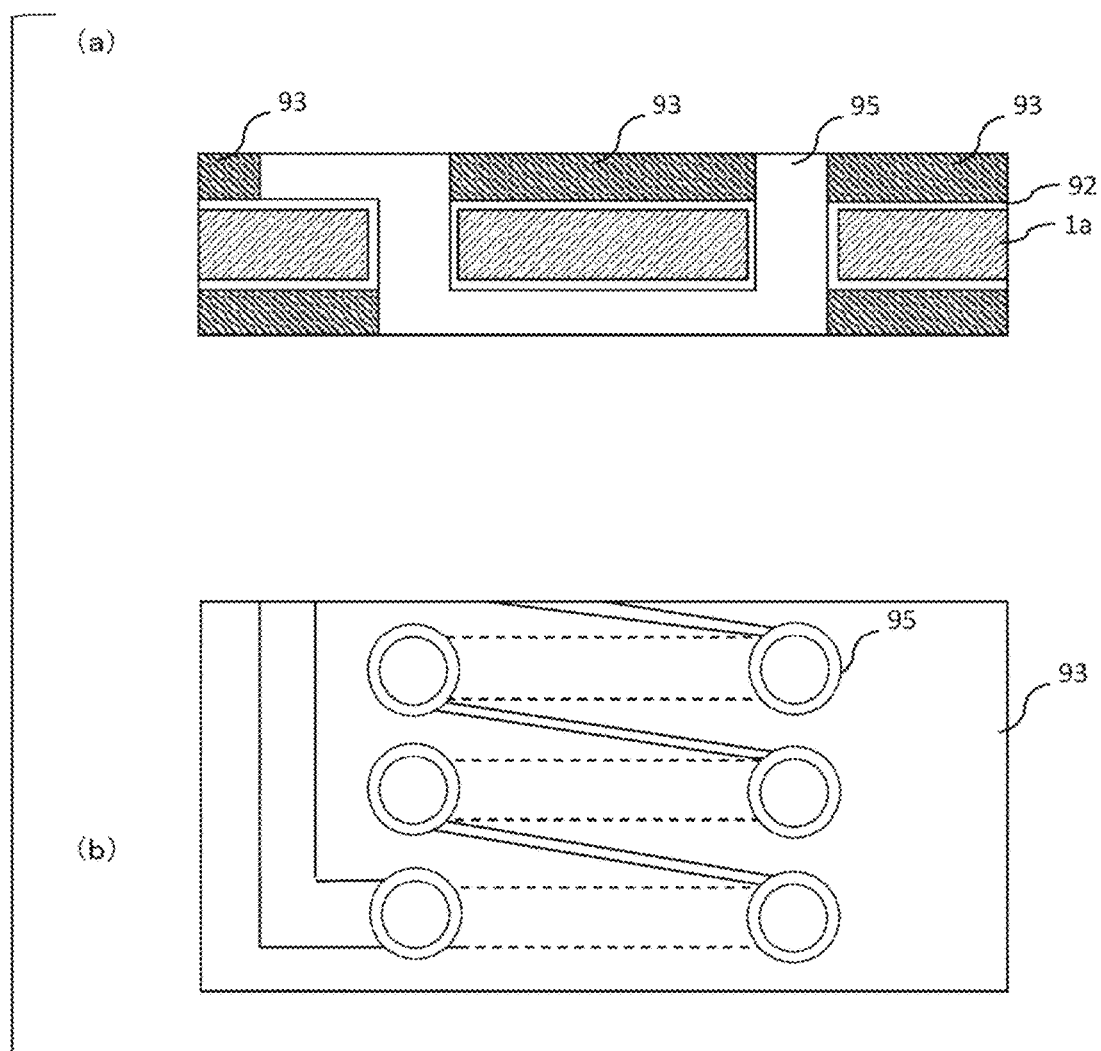
FIG. 6(a) is a longitudinal sectional view for explaining the manufacturing process advanced from FIG. 5(a)
FIG. 6(b) is a plan view of the drawing shown in FIG. 6(a).

Next, a resist film 93 is formed, and exposure and development are performed so that a place where a metal layer 95 such as copper plating described later is formed is removed. Thereafter, the metal layer 95 is formed by copper plating or the like, and portions corresponding to the winding wire part 10 and the winding return wire part 50 are formed (See FIG. 6).

Figure 7:
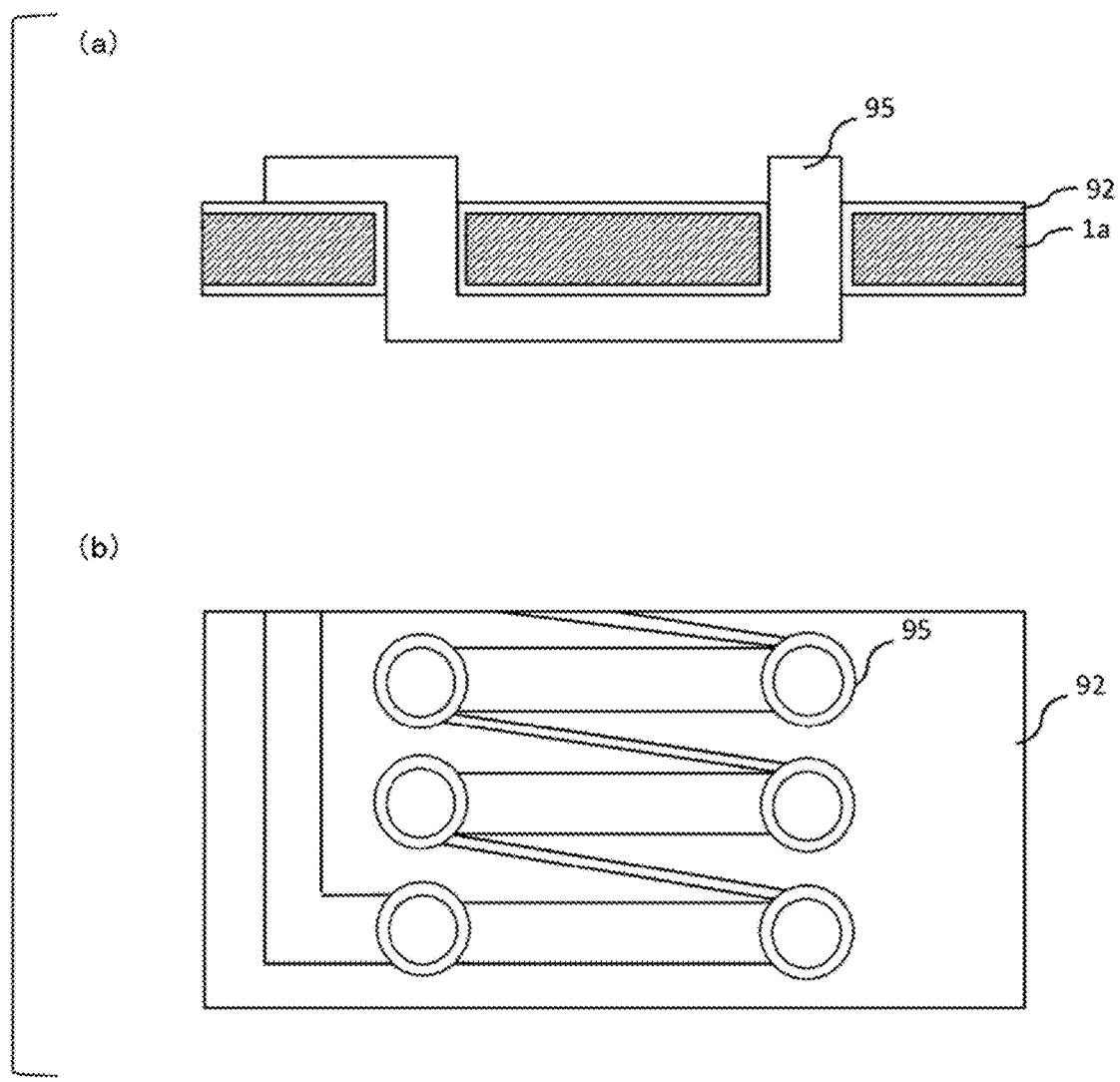
FIG. 7(a) is a longitudinal sectional view for explaining the manufacturing process advanced from FIG. 6(a)
FIG. 7(b) is a plan view of the drawing shown in FIG. 7(a).

Next, the resist film 93 is removed (See FIG. 7), and portions of the metal film 92 formed by sputtering other than the portions corresponding to the winding wire part 10 and the winding return wire part 50 are removed by etching (See FIG. 8). As a result, the first straight part 11, the second straight part 12, the third straight part 13, the fourth straight part 14, the fifth straight part 15, the sixth straight part 16, and the winding return wire part 50 are formed by the metal layer 95 and the metal film 92. It is to be noted that the transverse sectional area of each of the first straight part 11, the second straight part 12, the third straight part 13, the fourth straight part 14, the fifth straight part 15, the sixth straight part 16, and the winding return wire part 50 may be substantially the same. Using this substantially same transverse sectional area is advantageous in that the current flowing in the straight parts 11 to 16 and the winding return wire parts 50 can be made constant and the detection accuracy can be increased. In the present embodiment, "substantially the same" means being within a range of ±5% of an average value. When the average value of the transverse sectional areas of the first straight part 11, the second straight part 12, the third straight part 13, the fourth straight part 14, the fifth straight part 15, the sixth straight part 16, and the winding return wire part 50 is Sa, each of the transverse sectional areas of the first straight part 11, the second straight part 12, the third straight part 13, the fourth straight part 14, the fifth straight part 15, the sixth straight part 16, and the winding return wire part 50 is equal to or greater than 0.95×Sa and equal to or less than 1.05×Sa.

Next, a pair of cover films 1b made of, for example, polyimide is stuck to both surfaces, whereby the winding wire part 10 and the winding return wire part 50 are covered with the cover films 1b (FIG. 3). It is to be noted that if it is not necessary to insulate the winding wire part 10 and the winding return wire part 50, the cover films 1b may not be provided.

The winding wire electrode pad 19 and the winding return wire electrode pad 59 can be formed in the same manner as the metal layer 95 (the first straight part 11, the second straight part 12, the sixth straight part 16, the winding return wire part 50, and the like) provided on the surface of one side of the body film 1.

<<Function and Effect>>

Subsequently, an example of the function and effect according to the present embodiment configured as described above will be described. All the aspects to be described in "function and effect" can be employed in the above configuration.

By providing the detection substrate 150 having a Rogowski coil or a quasi Rogowski coil as in the present embodiment, it is possible to detect the operation (detection of change in current) of the existing semiconductor device 100 or the like, and it is possible to achieve high versatility.

When adopting an aspect in which the body film 1a is used and the winding wire part 10 and the winding return wire part 50 are provided in the body film 1a, it is possible to make the through hole 91 such as a via passing through the body film 1a small. As a result, the number of turns per unit length of the winding wire part 10 can be increased, and changes in current can be accurately detected. That is, when a printed substrate (its thickness is 0.4 mm, for example) such as a glass epoxy substrate is adopted, it is necessary to increase the diameter of the through hole such as a via because the thickness thereof is great. Therefore, the number of turns of the winding wire part 10 is reduced. On the other hand, it is possible to reduce the diameter of the through hole 91 by adopting the thin body film 1a having a thickness of equal to or less than 1/10 of the glass epoxy substrate, and as a result, it is possible to increase the number of turns per unit length of the winding wire part 10. In addition, use of a technique for manufacturing a flexible substrate allows micro wiring having a width of about 10 μm to be formed, and the number of turns per unit length of the winding wire part 10 to be increased. Furthermore, since miniaturization is possible as described above, it is possible to provide the small-sized detection substrate 150.

When adopting the aspect in which the body film 1a as described above is used and the detection substrate 150 is formed of a flexible substrate, it is advantageous in that the thickness can be reduced significantly. Furthermore, when the detection substrate 150 is made of a flexible substrate, it is excellent in flexibility and movable durability such as bending and folding resistance, and can be arranged in, for example, a narrow gap by bending as appropriate. Even when the detection substrate 150 is bent in this manner, for example, when the detection target part 300 is formed in the body part 1, the change of the current can be detected if the Rogowski coil or the quasi Rogowski coil is shaped to surround the periphery of the current flowing in the detection target part 300.

When polyimide is used as the body film 1a, it can withstand a voltage of, for example, 300 V/μm, and can achieve high voltage resistance. In addition, since it has high heat resistance, it can be used even at high temperatures.

The application of the aspect in which the winding return wire part 50 does not pass through the winding wire part 10 is significantly advantageous in that the manufacturing process can be facilitated. Specifically, when the aspect shown in FIG. 9 in which the winding return wire part 50 passes through the winding wire part 10 is employed, the process for forming the winding return wire part 50 inside the winding wire part 10 becomes complicated, which leads to an increase in manufacturing cost. On the other hand, when the winding return wire part 50 is not formed inside the winding wire part 10 as described with reference to FIGS. 3 to 8, the manufacturing process can be remarkably facilitated, and the manufacturing cost can be reduced. Thus, this aspect is advantageous.

In a case where the semiconductor device 100, which is the object to be measured, is a switching element such as a MOSFET, a current changes when the device 100 is switched between ON and OFF. In view of this, the use of the quasi Rogowski coil and the Rogowski coil according to the present embodiment is advantageous.

When the present embodiment is used, the winding return wire part 50 can be positioned outward of the periphery of the winding wire part 10. For this reason, the present embodiment is advantageous in that the winding wire part 10 can be disposed as close to the current flowing between the first electrode 61 and the second electrode 62 as possible.

When adopting the aspect of using the detection target part 300 in which a part of or the whole current flowing in the electronic device such as the semiconductor device 100 is used as the measurement target, it is advantageous in that the current flowing in the semiconductor device 100 can be indirectly measured even in the case where it is difficult to directly measure the current flowing in the semiconductor device 100 due to the positional relationship or the like.

When adopting an aspect in which the measurement target such as the semiconductor device 100 is placed on the detection substrate 150, it is advantageous in that the current flowing in the semiconductor device 100 can be indirectly measured only by placing the first electrode 61, the second electrode 62, and the like of the semiconductor device 100 so as to be connected to the detection target part 300.

When adopting an aspect in which the detection target part 300 is provided in the body part 1, it is possible to determine in advance the positional relationship between the path (the detection target part 300) through which the current flows in the body part 1 and the winding wire part 10 and the winding return wire part 50. Therefore, it is advantageous in that a change in current can be accurately measured.

It is to be noted that the aspect shown in FIG. 2 is an example, and the detection target part 300 only needs to be able to acquire a current from the detection target such as the semiconductor device 100, and may be arranged at any position.

Second Embodiment

Next, a second embodiment of the present invention will be described.

Figure 11:
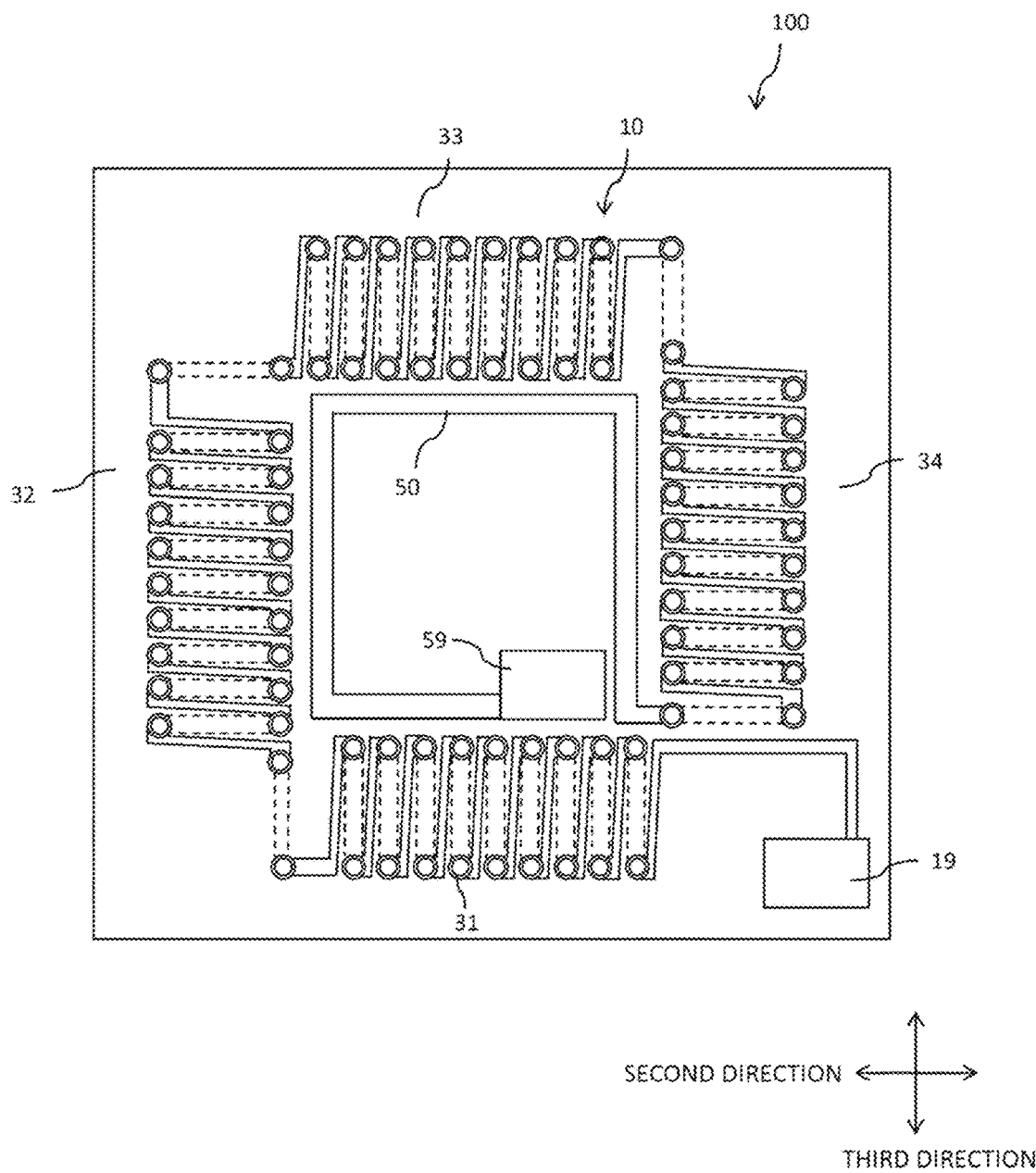
FIG. 11 is a plan view of a detection substrate that can be used in a second embodiment of the present invention.

The first embodiment assumes the aspect in which the winding return wire part 50 is provided outward of the periphery of the winding wire part 10, but the second embodiment assumes an aspect in which the winding return wire part 50 is provided inward of the periphery of the winding wire part 10 as shown in FIG. 11. Other configurations are the same as those of the first embodiment, and any configuration adopted in the first embodiment can be adopted in the second embodiment. The members described in the first embodiment will be described with the same reference numerals.

The present embodiment can also achieve the similar effects as the first embodiment. Furthermore, by adopting the present embodiment, the winding wire part 10 can be positioned outward of the periphery of the winding return wire part 50. Therefore, it is possible to increase the length of the winding wire part 10, and it is possible to increase the number of turns of the winding wire part 10. As a result, in some cases, it is advantageous in that the accuracy of detecting a change in current can be increased.

Third Embodiment

Next, a third embodiment of the present invention will be described.

Figure 12:
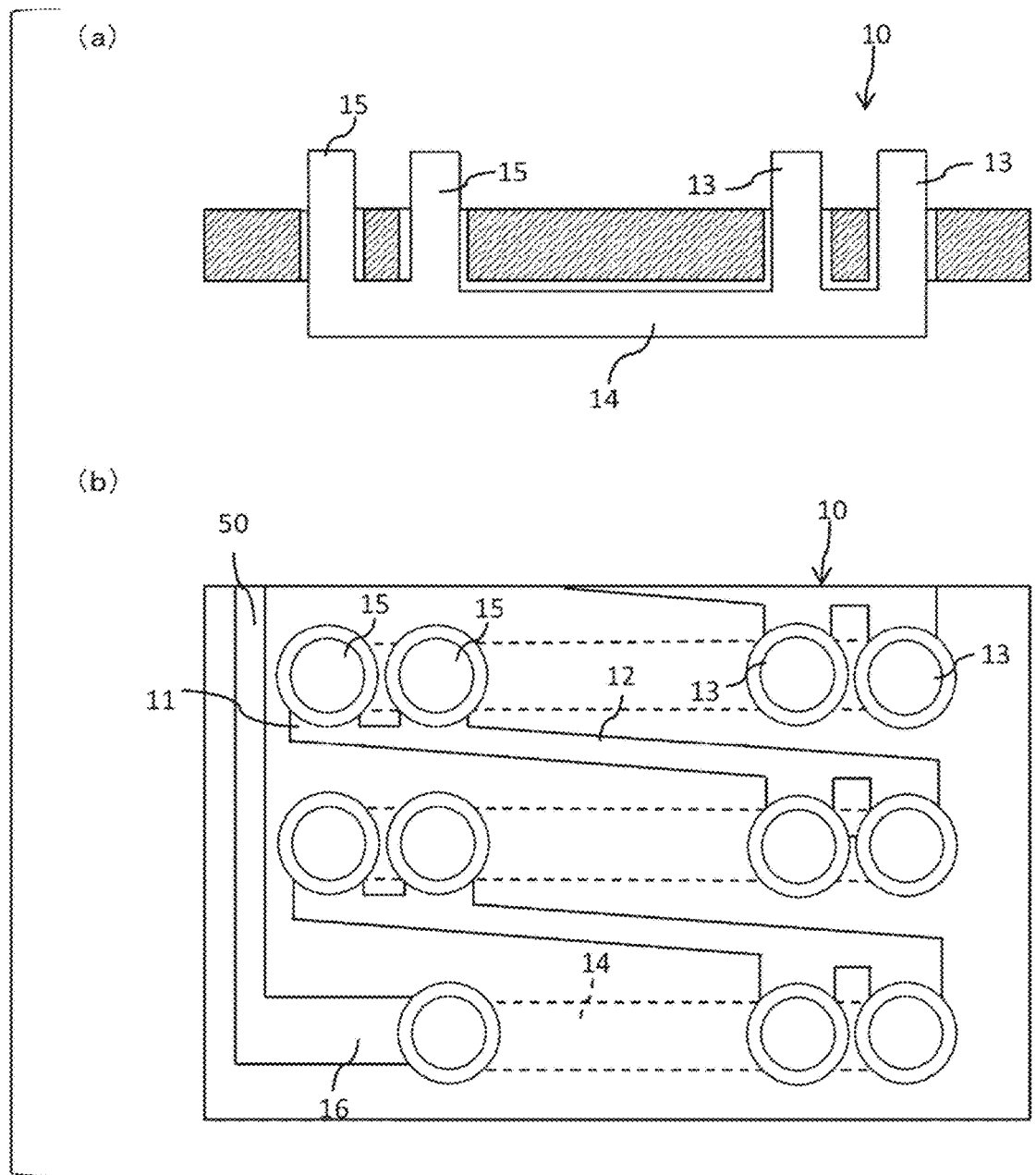
FIG. 12(a) is a longitudinal sectional view of a detection substrate that can be used in a third embodiment of the present invention.
FIG. 12(b) is a plan view of the detection substrate shown in FIG. 12(a).

The above embodiments assume the aspect in which only one third straight part 13 and one fifth straight part 15 are provided for the second straight part 12 and the fourth straight part 14. However, a plurality of third straight parts 13 and a plurality of fifth straight parts 15 may be provided for the fourth straight part 14 as shown in FIG. 12. For others, any of the configurations adopted in the above embodiments can be adopted in the present embodiment. The members described in the above embodiments will be described with the same reference numerals. It is to be noted that the fourth straight part 14 does not necessarily need to be provided with the plurality of third straight parts 13 and the plurality of fifth straight parts 15. Only a plurality of third straight parts 13 are provided for the fourth straight part 14, only a plurality of fifth straight parts 15 are provided for the fourth straight part 14; or a plurality of third straight parts 13 and/or a plurality of fifth straight parts 15 are provided for a part of the fourth straight parts 14 and only one third straight part 13 and only one fifth straight part 15 are provided for the remaining of the fourth straight parts 14.

When the metal layer 95 is formed by using copper plating or the like, due to the influence of surface tension or the like, the plating does not flow so as to fill the entire through hole 91, and as a result, the thickness of the metal film corresponding to the third straight part 13 and the fifth straight part 15 may become thin. In the present embodiment, a plurality of through holes 91 for forming the third straight part 13 and a plurality of through holes 91 for forming the fifth straight part 15 are provided for the fourth straight part 14, thereby giving a sufficient thickness as a whole.

Since the plurality of third straight parts 13 and the plurality of fifth straight parts 15 are provided in this manner, the transverse sectional area (plane cut in a direction perpendicular to the extending direction) of the through hole 91 may be smaller than the transverse sectional areas of the first straight part 11, the second straight part 12, the fourth straight part 14, and the sixth straight part 16. By reducing the transverse sectional area of the through hole 91 in this manner, plating such as copper plating may be facilitated to fill the entire through hole 91. It is to be noted that when this aspect is adopted, the transverse sectional area of each of the third straight part 13 and the fifth straight part 15 becomes smaller than the transverse sectional area of each of the first straight part 11, the second straight part 12, the fourth straight part 14, and the sixth straight part 16. Furthermore, when a plurality (e.g., two) of third straight parts 13 are provided for one fourth straight part 14, the total area of the transverse sections of the plurality (e.g., two) of third straight parts 13 may be substantially the same as the transverse sectional area of each of the first straight part 11, the second straight part 12, the fourth straight part 14, and the sixth straight part 16. Similarly, when a plurality (e.g., two) of fifth straight parts 15 are provided for one fourth straight part 14, the total area of the transverse sections of the plurality (e.g., two) of fifth straight parts 15 may be substantially the same as the transverse sectional area of each of the first straight part 11, the second straight part 12, the fourth straight part 14, and the sixth straight part 16.

Fourth Embodiment

Next, a fourth embodiment of the present invention will be described.

Figure 13:
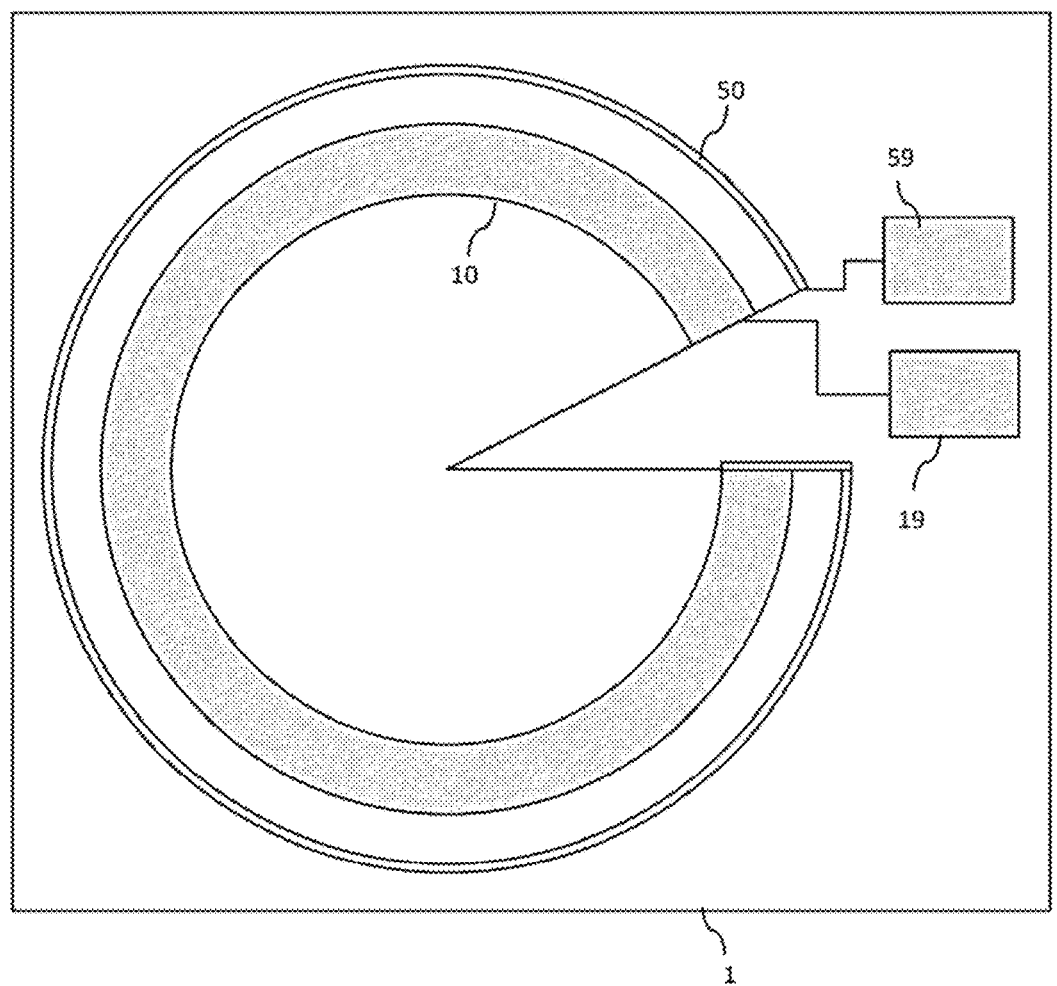
FIG. 13 is a plan view of a detection substrate that can be used in a fourth embodiment of the present invention.
Figure 13:
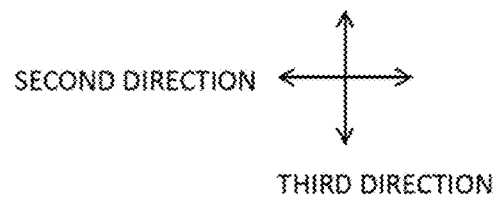

The above respective embodiments have described the aspect in which the winding wire part 10 has the A-direction winding wire part 31 extending in the second direction, the B-direction winding wire part 32 connected to the end of the A-direction winding wire part 31 and extending in the third direction, the C-direction winding wire part 33 connected to the end of the B-direction winding wire part 32 and extending in the second direction, and the D-direction winding wire part 34 connected to the end of the C-direction winding wire part 33 and extending in the third direction. However, the present invention is not limited thereto. As an example, each of the winding wire part 10 and the winding return wire part 50 may have a circular shape in a plan view (in a plane including the second direction and the third direction) as shown in FIG. 13. Alternatively, each of the winding wire part 10 and the winding return wire part 50 may have a triangular shape in a plan view. For the other configurations, any configurations adopted in the above respective embodiments can also be adopted in the present embodiment. The members described in each of the above respective embodiments will be described with the same reference numerals.

When the aspect shown in FIG. 13 is adopted, balanced detection of the current flowing between the first electrode 61 and the second electrode 62 can be expected. In view of facilitating the manufacturing process, it is advantageous to use an aspect in which straight shaped parts such as the A-direction winding wire part 31, the B-direction winding wire part 32, the C-direction winding wire part 33, and the D-direction winding wire part 34 as in the respective embodiments are connected to each other.

Fifth Embodiment

Next, a fifth embodiment of the present invention will be described.

In the above respective embodiments, one quasi Rogowski coil or Rogowski coil is provided. In contrast, in the present embodiment, a plurality of quasi Rogowski coils or Rogowski coils are provided. For the other configurations, any configurations adopted in the above respective embodiments can also be adopted in the present embodiment. The members described in each of the above respective embodiments will be described with the same reference numerals.

Figure 14:
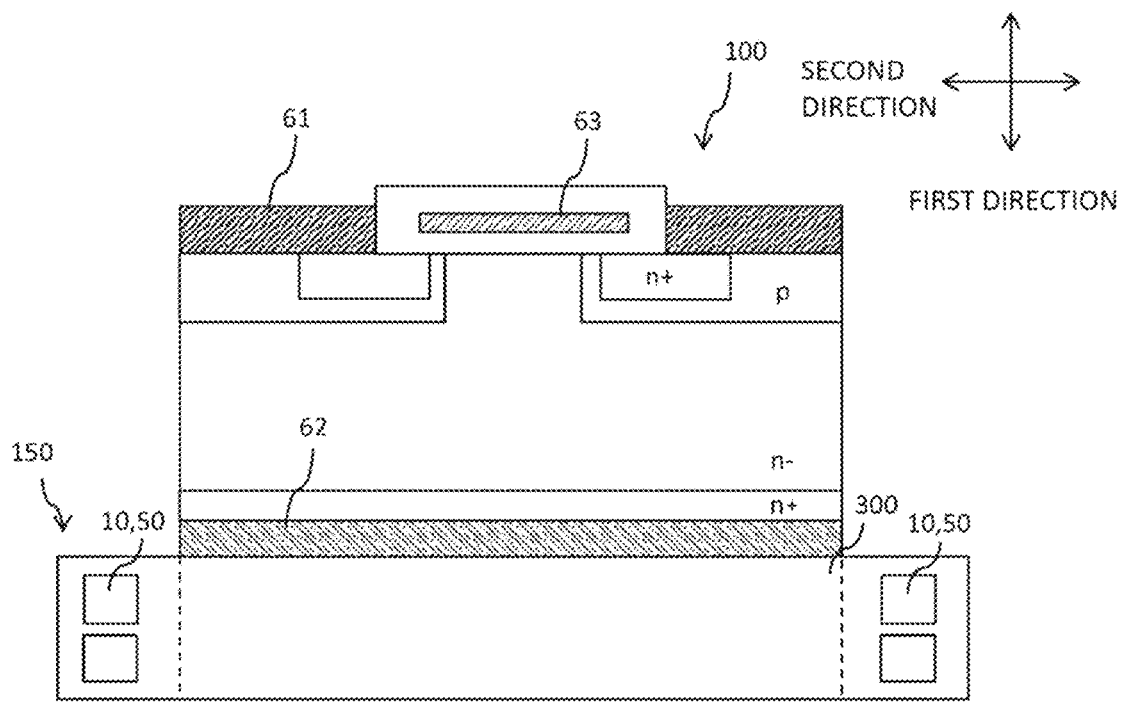
FIG. 14 is a longitudinal section of a detection substrate that can be used in a fifth embodiment of the present invention.

As shown in FIG. 14, quasi Rogowski coils or Rogowski coils in the body part 1 of the detection substrate 150 may be aligned in the first direction. More specifically, the winding wire part 10 and the winding return wire part 50 which does not pass through the winding wire part 10 (a quasi Rogowski coil), or the winding wire part 10 and the winding return wire part 50 passing through the winding wire part 10 (Rogowski coil) may be aligned in the first direction. When this aspect is adopted, a change in current can be detected at two or more locations in the first direction, which is advantageous in that a change in current can be detected more accurately. It is to be noted that even in the aspect in which one quasi Rogowski coil or Rogowski coil is provided as shown in the above embodiments, stacking two detection substrates 150 in the first direction results in an aspect similar to that shown in FIG. 14.

Figure 15:
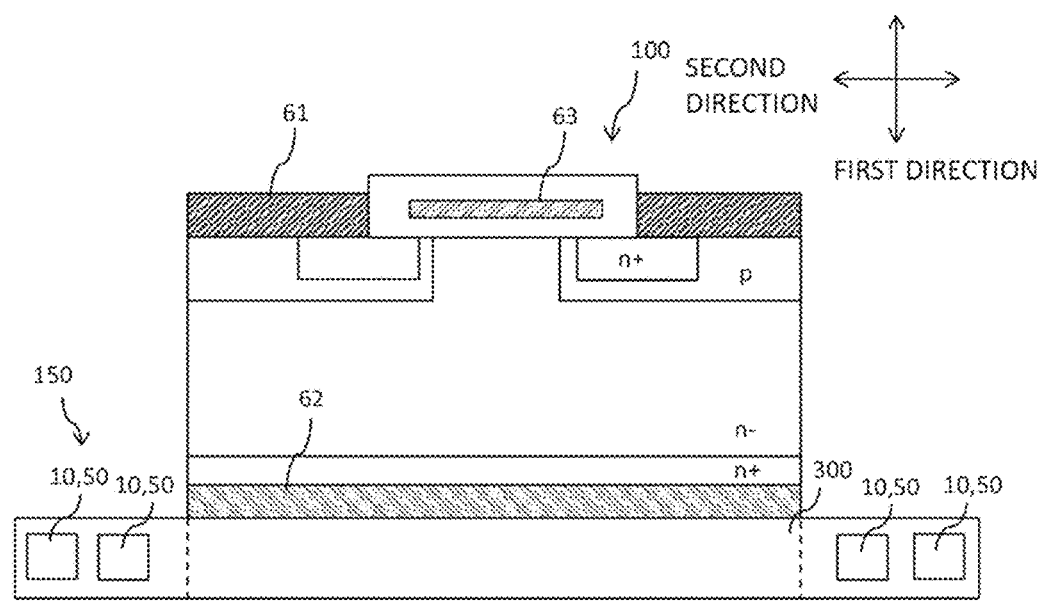
FIG. 15 is a longitudinal section of another detection substrate that can be used in the fifth embodiment of the present invention.

As shown in FIG. 15, another quasi Rogowski coil or Rogowski coil may be disposed on the outer peripheral side of the quasi Rogowski coil or Rogowski coil. More specifically, the winding wire part 10 and the winding return wire part 50 which does not pass through the winding wire part 10 (quasi Rogowski coil), or the winding wire part 10 and the winding return wire part 50 passing through the winding wire part 10 (Rogowski coil) may be aligned in the second direction or the third direction. When this aspect is adopted, a change in current can also be detected more accurately, which is advantageous. In addition, this aspect is also advantageous in that the similar manufacturing process as that of the first embodiment can be employed.

Figure 16:
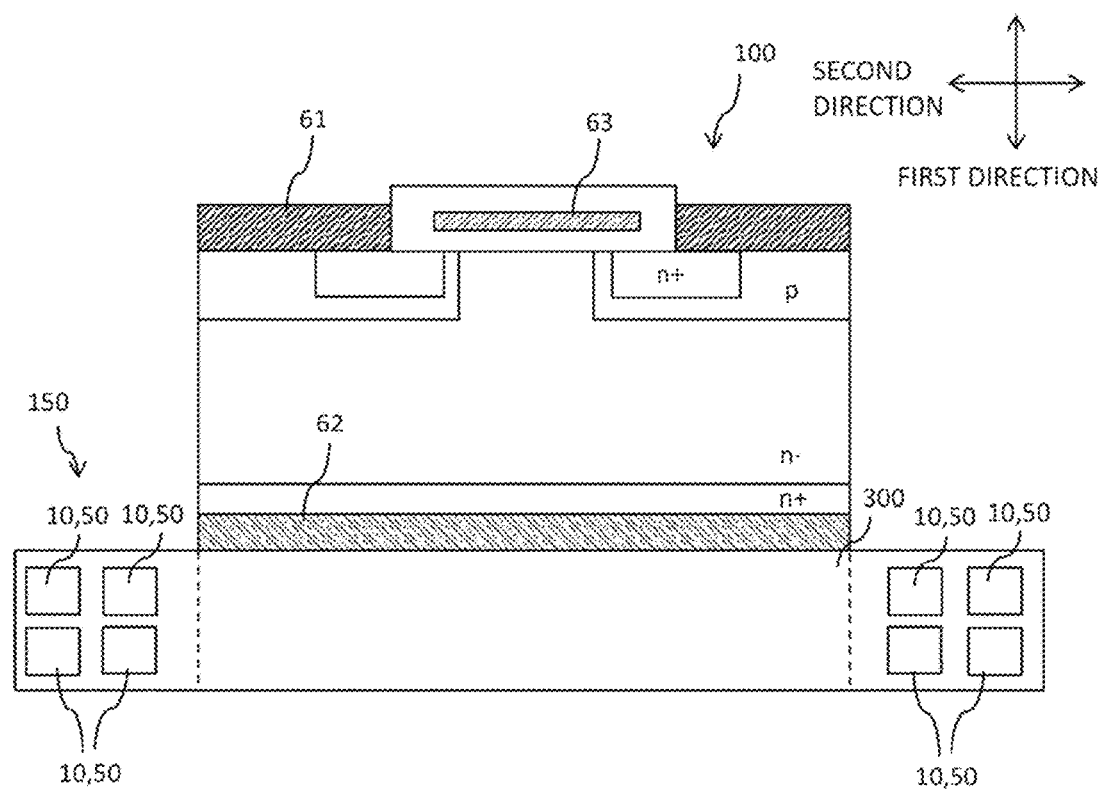
FIG. 16 is a longitudinal section of yet another detection substrate that can be used in the fifth embodiment of the present invention.

These aspects may be combined, and as shown in FIG. 16, the quasi Rogowski coils or Rogowski coils may be stacked in the first direction, and other quasi Rogowski coils or Rogowski coils may be provided on the outer peripheral side of the quasi Rogowski coils or Rogowski coils. More specifically, the winding wire parts 10 and the winding return wire parts 50 which do not pass through the winding wire parts 10 (quasi Rogowski coils), or the winding wire parts 10 and the winding return wire parts 50 passing through the winding wire parts 10 (Rogowski coils) may be aligned in the second direction or the third direction, and also aligned in the first direction. It is to be noted that stacking the two detection substrates 150 shown in FIG. 15 in the first direction results in an aspect similar to that shown in FIG. 16.

The foregoing descriptions of the embodiments and the disclosure of the drawings are merely one example for describing the present invention recited in the claims. The present invention recited in the claims shall not be limited by the foregoing descriptions of the embodiments and the disclosure of the drawings. Further, the recitations of the claims at the time of the filing of the present application are merely an example, and the recitations of the claims can be changed as appropriate based on the description of the specification, the drawings, and the like.

REFERENCE SIGNS LIST

1a Body film
10 Winding wire part
12 Second straight part
13 Third straight part
14 Fourth straight part
15 Fifth straight part
50 Winding return wire part
91 Through hole
92 Metal film
95 Metal layer
150 Detection substrate
300 Detection target part

The invention claimed is:
1. A detection substrate comprising:
a body film having a through hole;
a winding wire part provided on a surface of one side of the body film, on a surface of another side of the body film and in the through hole, and disposed so as to surround a current to be detected; and
a winding return wire part, provided on the body film, connected at a terminal end part of the winding wire part and returning from the terminal end part toward a starting end part side, wherein the winding wire part has second straight parts provided on the surface of the one side of the body film, a third straight part extending from an end part of one of the second straight parts so as to pass through the through hole, one of fourth straight parts provided on an end part of the third straight part and provided on the surface of the other side of the body film, and a fifth straight part extending from an end part of the one of the fourth straight parts so as to pass through the through hole, and a plurality of the third straight parts and/or a plurality of the fifth straight parts are provided for the one of the fourth straight parts.

2. The detection substrate according to claim 1, wherein the winding return wire part is provided on the surface of the one side of the body film or the surface of the other side of the body film.

3. The detection substrate according to claim 1, wherein the winding return wire part does not pass through the winding wire part.

4. The detection substrate according to claim 3, wherein the winding return wire part is provided inward or outward of a periphery of the winding wire part.

5. The detection substrate according to claim 1, wherein
when a plurality of the third straight parts are provided, a transverse sectional area of each of the third straight parts is smaller than a transverse sectional area of the second straight part and a transverse sectional area of the fourth straight part, and
when a plurality of the fifth straight parts are provided, a transverse sectional area of each of the fifth straight parts is smaller than a transverse sectional area of the second straight part and a transverse sectional area of the fourth straight part.

6. The detection substrate, according to claim 1, further comprising:
a detection target part, which is provided in the body film and through which at least a part of current flowing in an object to be measured flows, wherein
the winding wire part and the winding return wire part are disposed so as to surround the detection target part.

7. An assembly comprising:
the detection substrate according to claim 6; and
an electronic device, which is the object to be measured, disposed on the detection substrate.

8. A method for manufacturing a detection substrate, comprising steps of:
forming a through hole in a body film;
forming a metal film in the body film and the through hole;
forming a metal layer at portions, corresponding to a winding wire part and a winding return wire part, on the metal film; and
removing portions of the metal film other than the portions corresponding to the winding wire part and the winding return wire part, wherein
the winding wire part is formed by the metal layer and the metal film on a surface of one side of the body film, on a surface of another side of the body film and in the through hole, and
the winding return wire part is formed by the metal layer and the metal film on the surface of the one side of the body film or the surface of the other side of the body film, wherein
the winding wire part has second straight parts provided on the surface of the one side of the body film, a third straight part extending from an end part of one of the second straight parts so as to pass through the through hole, one of fourth straight parts provided on an end part of the third straight part and provided on the surface of the other side of the body film, and a fifth straight part extending from an end part of the one of the fourth straight parts so as to pass through the through hole, and
a plurality of the third straight parts and/or a plurality of the fifth straight parts are provided for the one of the fourth straight parts.

* * * * *